United States Patent
Ochiai

(10) Patent No.: US 7,216,281 B2
(45) Date of Patent: May 8, 2007

(54) FORMAT CONTROL CIRCUIT AND SEMICONDUCTOR TEST DEVICE

(75) Inventor: Katsumi Ochiai, Tokyo (JP)

(73) Assignee: Advantest Corp., Tokyo (JP)

( * ) Notice: Subject to any disclaimer, the term of this patent is extended or adjusted under 35 U.S.C. 154(b) by 162 days.

(21) Appl. No.: 10/952,678

(22) Filed: Sep. 29, 2004

(65) Prior Publication Data

US 2006/0069975 A1    Mar. 30, 2006

(51) Int. Cl.
*G01R 31/28* (2006.01)

(52) U.S. Cl. ....................................... 714/738
(58) Field of Classification Search ................ 714/724, 714/738
See application file for complete search history.

(56) References Cited

U.S. PATENT DOCUMENTS

| | | | | |
|---|---|---|---|---|
| 4,755,758 | A * | 7/1988 | Orihashi | 327/100 |
| 4,852,093 | A * | 7/1989 | Koeppe | 714/33 |
| 6,291,981 | B1 | 9/2001 | Sartschev | |
| 2002/0035708 | A1* | 3/2002 | Ishida et al. | 714/25 |
| 2004/0051518 | A1 | 3/2004 | Sartschev et al. | |

FOREIGN PATENT DOCUMENTS

| | | |
|---|---|---|
| JP | 07-110357 | 4/1995 |
| JP | 07-174827 | 7/1995 |
| JP | 08-062292 | 3/1996 |
| JP | 08-094711 | 4/1996 |
| JP | 08-094722 | 4/1996 |
| JP | 2000-039469 | 2/2000 |
| JP | 2002-228721 | 8/2002 |
| WO | WO 96/31002 | 10/1996 |
| WO | WO 2004/008157 | 1/2004 |

OTHER PUBLICATIONS

Teruo Tamama et al. "Key Technologies for 500-MHz VLSI Test System "Ultimate"", NTT LSI Laboratories, Sep. 12, 1988.

* cited by examiner

*Primary Examiner*—Cynthia Britt
(74) *Attorney, Agent, or Firm*—Muramatsu & Associates

(57) ABSTRACT

There is provided a semiconductor test apparatus which assuredly detects an inhibited edge only which affects a test pattern and truly requires an error warning. This semiconductor test apparatus includes: a real time selector which receives a plurality of sets of waveform data, receives a plurality of sets of timing data, selects and outputs predetermined waveform data and timing data, inhibits a next edge immediately following the current edge and outputs an inhibiting signal when an edge with the same polarity which is continuous in an interval shorter than a proximity limit time exists in the waveform data; and a detector which receives the waveform data, the timing data and the open signal, and outputs fail signal when an edge with a polarity reverse to that of an inhibited edge exists in the proximity limit time before the inhibited edge.

6 Claims, 8 Drawing Sheets

Fig.4

| | | ROINT | ROINTN | REF. EDGE | IGNORED RANGE | CURRENT CYCLE | PRE. CYCLE | OPEN DETECTION |
|---|---|---|---|---|---|---|---|---|
| I NO OPEN EDGE | Previous Cycle / Current Cycle diagram | 0 | 0 | S | 1-4 | NONE | NONE | PASS |
| | | 0 | 0 | SX | 1-4 | NONE | NONE | PASS |
| II 1 EDGE OPENED | (1) CURRENT OPEN | 1 | 0 | S | 1-6 | NONE | NONE | PASS |
| | | 1 | 0 | SX | 1,5,6 | 2,3 (INCL. S) | 4 | PASS/FAIL (*A) |
| | (2) PREVIOUS OPEN | 1 | 0 | S | 1-6 | NONE | NONE | PASS |
| | | 1 | 0 | SX | 1,2,6 | 3 | 4,5 (INCL. PS) | PASS/FAIL (*A) |
| III 2 EDGE OPENED | | 1 | 1 | S | 1,5,6 | 2,3 | 4 (INCL. PS) | PASS/FAIL (*A) |
| | | 1 | 1 | SX | 1,2,6 | 3 | 4,5 (INCL. PS) | PASS/FAIL (*A) |

(*A)
NO EDGE IN CURRENT → PASS IF MAXIMUM IN PREVIOUS HAS SAME POLARITY, AND FAIL IF REVERSE POLARITY
EDGE IN CURRENT → PASS IF MAXIMUM IN PREVIOUS HAS SAME POLARITY, AND FAIL IF REVERSE POLARITY

Fig. 5

(a) NEXTOPN + 1 EDGE (b) NEXTOPN + 1 EDGE IN 2 EDGES (c) NEXTOPN + 2 EDGES IN 2 EDGES

FORMAT CONTROL CIRCUIT AND SEMICONDUCTOR TEST DEVICE

FIELD OF THE INVENTION

The present invention relates to a semiconductor test apparatus which comprises a waveform formatter circuit which generates a test pattern to be applied to a DUT, and judges the quality of the DUT by comparing a response output signal from the DUT having the test pattern applied thereto with a predetermined expected data signal, and more particularly to a waveform formatter circuit and a semiconductor test apparatus which automatically inhibit a proximate following edge when an edge of a test pattern conflicts with a proximity limit of a reference clock, detect its inhibited timing edge, and identify whether the inhibited edge is an edge which affects the test pattern in order to assuredly detect only an inhibited edge which truly requires an error warning or the like.

BACKGROUND OF THE INVENTION

In a semiconductor test apparatus which tests a semiconductor component such as an IC or an LSI as a device under test (DUT), a predetermined test pattern is applied to the DUT, an output signal which is output from the DUT as a result of test pattern application is fetched with a timing of a predetermined strobe signal, and the fetched output signal is compared with a predetermined expected signal (an expected pattern) to determine the quality of an operation of the DUT (see, e.g., Japanese Patent Application Laid-open No. 110357-1995: pp. 4–6, FIG. 1, Japanese Patent Application Laid-open No. 174827-1995: pp. 4–5, FIG. 1, and Japanese Patent Application Laid-open No. 062292-1996: pp. 3–4, FIG. 1).

Test pattern data applied to the DUT comprises waveform data (format control data) indicative of a waveform corresponding to a logical pattern and timing data (timing set data) indicative of a timing of an edge in this waveform, arbitrary waveform data and timing data are selected from a plurality of sets of waveform data and timing data, thereby generating a desired test pattern.

Here, in order to highly accurately evaluate characteristics of the DUT, generation of a test pattern with a highly accurate timing is demanded in recent semiconductor test apparatuses, and it is often the case that a timing set in the test pattern (a delay time of an edge with respect to a predetermined reference of a test cycle) is a sum of an integral multiple of a reference clock (Reference Clock: REFCLK) and a fraction or only an integral multiple of the reference clock. Therefore, timing data (delay data) indicative of an edge timing of waveform data is also constituted by a combination of integral multiple data (Gate Enable: GTE) of a reference clock cycle and high resolution data (High Resolution: HR) as fractional data of the reference clock.

Further, in recent semiconductor test apparatuses, combinations of a plurality of sets of waveform data are usually utilized so that further complicated test patterns can be generated.

For example, a plurality of groups (a group of set signals: T1S, T2S . . . TnS, a group of reset signals: T1R, T2R . . . T2R) are prepared as waveform data, and a timing pulse is generated by arbitrarily combining the set signals and the reset signals.

Further, such set signals and reset signals are supplied to a flip-flop, and a rising edge or a falling edge of a test pattern is formed.

FIG. 6 is a block diagram showing a schematic structure of a conventional semiconductor test apparatus.

As shown in this drawing, the conventional semiconductor test apparatus comprises a pattern generator (PG) 110, timing generators 120, a waveform memory 130, a real time selector 140 and others, a plurality of sets of waveform data output from the waveform memory 130 and a plurality of sets of timing data output from the timing generator are selected by the real time selector 140, and a test pattern input to a DUT (not shown) as a device under test is generated.

Of these components, the waveform memory 130 and elements on the next stage constitute a waveform formatter circuit.

It is to be noted that the semiconductor test apparatus shown in FIG. 6 is a pin multiplex mode tester using two sets of data in one test cycle, waveform data of groups T1 and T2 are generated from the waveform memory 130, and two timing generators 120 of T1 and T2 are provided in accordance with the groups of the waveform data from the waveform memory 130.

The pin multiplex mode is a mode in which a high-speed test signal or strobe signal is generated by combining (multiplexing) test patterns or strobe signals generated from a plurality of test channels (tester pins) of the semiconductor test apparatus on a time base.

The PG 110 outputs pattern data (PAT A/B/C) which becomes an address of a logical pattern (waveform data) which is applied to a DUT, a timing set (TS) which becomes an address of timing data indicative of a switching timing for the pattern data, and a rate signal which serves as a test rate.

The plurality of timing generators 120 are provided in accordance with the groups of the waveform data from the waveform memory 130, the two timing generators of T1 and T2 are provided in the example shown in FIG. 6, and each timing generator 120 comprises a timing memory 121 and a counter delay 122.

The timing memory 121 stores a delay timing of a clock with respect to a timing set, and generates a set time and a reset time of waveform data read from the waveform memory 130.

Specifically, the timing memory 121 stores a GATE signal used to select any clock of reference clocks REFCLK and an HR signal which is high-resolution delay data which is not more than a cycle of this REFCLK, and the reference clock REFCLK corresponds to 4 ns in the example shown in FIG. 6.

Further, the GATE signal and the HR signal are read with a timing set (TS) output from the PG 110 being used as an address, the HR signal is input to a real time selector 140 on the next stage as it is, and the GATE signal is output with a timing of a rate signal (RATE) input to the counter delay 122 and then input to the real time selector 140.

The waveform memory 130 stores waveform data (a SET/RES beat) corresponding to a logical pattern. Furthermore, respective waveform data of a set time and a reset time are read from the waveform memory 130 with pattern data (PAT A/B/C) output from the PG 110 being used as addresses.

In the waveform memory 130 shown in FIG. 6, respective waveform data of a set time and a reset time of pattern data in two groups (T1, T2) are output and then input to the real time selector 140 on the next stage.

The waveform memory 130 has, e.g., eight words, and a word is specified by three bits (A/B/C) of the pattern data (PAT). Data such as driver high-level drive first data T1S, driver low-level drive first data T1R, driver high-level drive second data T2S and driver low-level drive second data T2R is read every time each word is read.

It is to be noted that, as to a storage content of this waveform memory 130, it differs depending on a type of waveform to be generated, i.e., whether a non-return waveform NRZ, its inverse waveform/NRZ, a return waveform RZ, its inverse waveform/RZ, an exclusive OR waveform XOR, its inverse waveform/XOR and others, and a waveform is formed in accordance with the storage content.

The real time selector 140 receives respective signals from the timing generator 120 and the waveform memory 130 on a set side (SET) and a reset side (RES), selects arbitrary data in real time, and outputs the selected data as a set signal (SET) and a reset signal (RES).

The set signal (SET) and the reset signal (RES) output from the real time selector 140 are distributed to a set side and a reset side of a timing circuit (Pin Timing Generator: PTGA) 160 on the next stage. In the example shown in FIG. 6, an upper timing circuit (PTGA) 160a is a set signal passage (path) and a lower timing circuit (PTGA) 160b is a reset signal passage (path).

Moreover, the set signal and the reset signal are supplied to a flip flop 170, and a rising edge or a falling edge of a test signal are formed based on timings of these signals.

In the semiconductor test apparatus having the above-described structure, when a pattern is started, signals from the PG 110 access the waveform memory 130 and the timing memory 121, and outputs from these members are input to the real time selector 140.

Specifically, when a pattern is started, timing data TS and a rate signal RATE are supplied to the timing memory 121 and the counter delay 122 from the PG 110, and a delay quantity HR and a reference timing GTE read from the timing memory 121 are output.

Additionally, waveform data is read from the waveform memory 130 by using pattern data PAT from the PG 110, input to the real time selector 140 with a timing of the reference timing GTE, and selected and output with a delay timing of the delay quantity HR.

Further, this data is applied to a non-illustrated DUT through the timing circuit (PTGA) 160 and the flip flop 170.

Meanwhile, generally, in the semiconductor test apparatus, an interval between signals which are supplied to the same signal passage must be larger than that of a reference clock. For example, each of an interval between two set signals in the signal passage on the set side 160a of the timing circuit (PTGA) 160 and an interval between two reset signals in the signal passage on the reset side 160b of the same shown in FIG. 6 must be larger than a reference clock cycle. That is because each functional element, each circuit or the like is configured to operate in synchronization with a reference clock in the semiconductor test apparatus, a signal having a smaller cycle than the cycle of the reference clock cannot be recognized, and such a signal cannot be correctly transmitted.

As described above, in the semiconductor test apparatus, when a high-speed pulse exceeding a limit of the reference clock REFCLK is applied, a normal operation cannot be carried out. Here, within the context of the background art and the present invention, such a limit is referred to as a "proximity limit". Typically, a proximity limit time is a time length of one cycle of the reference clock.

Therefore, when HR signals each indicating a delay timing of a high resolution are continuously applied in a cycle not longer than that of the reference clock REFCLK, the PTGA cannot differentiate and recognize the second pulse, and it responds to a smaller HR signal as though one continuous pulse were applied.

Thus, in the prior art, a signal which conflicts with a proximity limit of a clock of the PTGA 160 on the later stage is eliminated in advance so that such a signal cannot be output in the real time selector 140 (see, e.g., Japanese Patent Application Laid-open No. 094722-1996: pp. 2–3, FIG. 1, and Japanese Patent Application Laid-open No. 228721–2002: pp. 4–5, FIG. 1)

Specifically, if the same reference clock cycle has one waveform data edge, the real time selector 140 selects and outputs this edge and the corresponding timing data. If the same reference clock cycle has a plurality of waveform data edges, the real time selector 140 compares the sets of timing data associated with the respective edges, and selects and outputs an edge having small timing data and this timing data. Furthermore, as to edge data having large timing data, the real time selector 40 opens (inhibits) this edge data so that this data cannot be output. It should be noted that within the context of the background art and the present invention, a term "open" is used for describing a situation where a signal or data is inhibited or prohibited to be transmitted to later stages.

Based on this, in any case, a signal which is proximate to or exceeds the proximity limit time derived from a reference clock cycle (e.g., 4 ns) is not input to the PTGA.

A concrete example of a test pattern generated in the conventional semiconductor test apparatus will now be described with reference to FIG. 7.

FIG. 7 shows a timing chart of a test pattern generated in the above-described conventional semiconductor test apparatus. In the example shown in this drawing, a reference clock REFCLK is 4 ns, and a test rate RATE is set to 4 ns which is the same as the reference clock.

It is to be noted that the reference clock REFCLK remains unchanged (fixed) by its semiconductor test apparatus, but the test rate RATE can be set to a desired cycle which is an integral multiple of the reference clock REFCLK, and this setting can be arbitrarily performed by a user or the like.

As shown in this drawing, respective sets of waveform data T1S, T1R, T2S and T2R are input to the set side (SET) and the reset side (RES) of the real time selector 140 with a timing of the reference timing GTE. Moreover, delay timing data T1HR and T2HR corresponding to the respective sets of waveform data T1 and T2 are input to the set side (SET) and the reset (RES) side of the real time selector 140.

In the real time selector 140, if the same reference clock cycle has one waveform data edge, this edge and corresponding timing data are selected and output. If the same reference clock cycle has a plurality of waveform data edges, respective sets of timing data corresponding to the respective edges are compared with each other, and an edge having small timing data and this timing data are selected and output.

Additionally, as to an edge having large timing data, this edge data is opened so that it cannot be output.

In the example shown in FIG. 7, in the first cycle of the reference clock cycle, since the SET signal is T1S only, T1S is selected, and the SET signal is output with a delay timing of 0.5 ns indicated by T1HR.

In the second cycle of the reference clock cycle, since the RES signal is T1R only, T1R is selected, and the RES signal is output with a delay timing of 1.0 ns indicated by T1HR.

In the third cycle of the reference clock cycle, since both T1S nd T2S exist as the set signal, values of the delay timing data T1HR (0.5 ns) and T2HR (3.0 ns) corresponding to the respective sets of waveform data are compared with each other, T1S having a smaller value is selected, and the SET signal is output with a delay timing of 0.5 ns indicated by T1HR. In this third cycle, T2S having large delay timing data is opened and erased (see SET 3.0 indicated by an upward broken arrow in FIG. 7), and it is not output from the real time selector 140. In other words, the set signal (edge) T2S is inhibited to be transferred to the later stages.

Thereafter, the waveform data and the timing data are likewise selected in accordance with each cycle, and the set signal (SET) and the reset signal (RESET) such as shown in FIG. 7 are output from the real time selector 140. Further, these set signal and reset signal are supplied to the timing circuit (PTGA) 160 and the flip flop 170, and a test pattern (PAT) having such a rising edge or falling edge as shown in the lowermost column in FIG. 7 is generated.

In this manner, by opening (inhibiting) a clock which conflicts with a proximity limit in the real time selector 140, namely, a clock which is proximate to or exceeds a reference clock cycle (e.g., 4 ns) is not input to the PTGA on the later stage, and hence the semiconductor test can be accurately conducted based on the reference clock.

In the above-described conventional semiconductor test apparatus, however, data of an edge timing which conflicts with the limit is opened and erased by the proximity limit of the clock, which results in a problem that an output waveform varies due to opening the edge when the timing setting is changed by a user.

For example, as shown in FIG. 8(*a*), it is assumed that the set signal and the reset signal are output with a timing which does not conflict with the proximity limit. In this case, it is assumed that the timing setting is changed by a user or the like so that a delay timing of SET=1.0 ns of the first cycle shown in FIG. 8(*a*) is changed to SET=2.0 ns.

Then, as shown in FIG. 8(*b*), since SET=2.0 ns of the second cycle conflicts with the proximity limit of 4 ns with respect to SET=2.0 ns of the first cycle, SET=2.0 ns of the second cycle is opened. As a result, an output waveform is changed to a waveform which is different from the correct waveform shown in FIG. 8(*a*).

Even in such a case, however, if an edge of RES=3.0 ns does not exist before the opened edge shown in FIG. 8(*b*), the subsequent output waveform is not changed even if SET=2.0 ns of the second cycle is opened.

As described above, when a given edge conflicts with the proximity limit of the clock and is thereby opened, there are a case where the subsequent output waveform is changed due to this opening and another case where the output waveform is not changed and hence there is actually no impact.

In the conventional semiconductor test apparatus, however, when the clock is opened, the fact that the clock is opened can be detected. However, the conventional apparatus cannot detect a difference between opening which affects the above-described output waveform and opening which does not affect the same.

Therefore, there is a problem that opening of the edge which is truly required for correct waveform generation cannot be accurately detected.

SUMMARY OF THE INVENTION

The present invention is proposed in order to solve the problems of the above-described prior art, and it is an object of the present invention to provide a waveform formatter circuit and a semiconductor test apparatus which can automatically open (inhibit) a proximate following edge when an edge of a test pattern conflicts with a proximity limit of a reference clock, detect the opened timing edge and identify whether the opened edge is an edge which affects the test pattern, thereby assuredly detecting the opened edge only which truly requires an error warning or the like. It should be noted that within the context of the present invention, the term "open" is used for describing a situation where a signal or data is inhibited or suppressed to be transmitted to later stages of a waveform formatter circuit and a semiconductor test apparatus.

To achieve this aim, according to a waveform formatter circuit of the present invention, there is provided a waveform formatter circuit which generates a test pattern which is input to a DUT, comprising: a real time selector which receives a plurality of sets of waveform data output from a waveform memory, receives a plurality of sets of timing data output from a timing generator, selects and outputs predetermined waveform data and timing data, and opens (inhibits) a continuous following edge and outputs a predetermined open (inhibiting) signal when an edge with the same polarity which is continuous in an interval shorter than a predetermined proximity limit time exists in edges of the waveform data; and an open (inhibit) detector which receives the waveform data, the timing data and the open signal output from the real time selector, and outputs a predetermined fail signal when an edge with a polarity reverse to that of the edge opened by the real time selector exists in the predetermined proximity limit time before the opened edge.

Specifically, according to the waveform formatter circuit of the present invention, if one waveform data edge exists in the same reference clock cycle, the real time selector selects and outputs this edge and corresponding timing data; and if a plurality of waveform data edges exist in the same reference clock cycle, the real time selector compares timing data corresponding to respective edges with each other, selects and outputs an edge with small timing data and this timing data, opens an edge with large timing data and outputs an open signal, and outputs timing data corresponding to the opened edge.

Furthermore, according to the waveform formatter circuit of the present invention, in case of opening a following edge which is continuous in the predetermined proximity limit time, the real time selector outputs different open signals depending on a case where one edge is opened and a case where a plurality of edges are opened.

Moreover, according to the waveform formatter circuit of the present invention, if a maximum edge whose corresponding timing data is smaller than timing data of an opened edge opened in the real time selector exists in a reference clock cycle to which the opened edge belongs, the open detector outputs a fail signal when a polarity of the edge is reverse to that of the opened edge; and if a maximum edge whose corresponding data is larger than timing data of the opened edge exists in a reference clock cycle before the reference clock cycle to which the opened edge belongs, the open detector outputs the fail signal when a polarity of the edge is reverse to that of the opened edge.

Additionally, according to the present invention, there is provided a semiconductor test apparatus semiconductor which inputs a predetermined test pattern to a DUT, and compares a response output signal output from the DUT with a predetermined expected data signal, thereby judging the quality of the DUT, comprising: a waveform formatter circuit which generates a test pattern which is input to the DUT.

In particular, according to the semiconductor test apparatus of the present invention, it is preferable that the plurality of waveform formatter circuits are provided in accordance with per-pins of a DUT.

As described above, according to the waveform formatter circuit and the semiconductor test apparatus of the present invention, when an edge of a test pattern conflicts with a proximity limit of a reference clock, a real time selector automatically opens a proximate following edge, and the opened timing edge is detected by an open detector, and a fail signal is output only when an edge having a polarity which is reverse to that of the opened edge exists in a proximity limit time before the opened edge.

As a result, it is possible to assuredly detect an opened edge only which affects a test pattern and truly requires an error warning or the like, and an accurate semiconductor test based on a reference clock can be assuredly conducted.

BRIEF DESCRIPTION OF THE DRAWINGS

FIG. 4 is a table showing an operation principle of the open detector included in the waveform formatter circuit according to the embodiment of the present invention;

FIGS. 5(a)–5(c) are tables showing examples of signals input/output to/from the open detector included in the waveform formatter circuit according to the embodiment of the present invention;

FIGS. 8(a) and 8(b) are timing charts showing a case where an output waveform varies when a signal is opened due to a proximity limit in the semiconductor test apparatus, in which FIG. 8(a) shows a correct waveform which does not conflict with the proximity limit and FIG. 8(b) shows a case where the output waveform varies when the signal conflicts with the proximity limit and a following edge is opened.

DETAILED DESCRIPTION OF THE INVENTION

A preferred embodiment of a waveform formatter circuit and a semiconductor test apparatus according to the present invention will now be described hereinafter with reference to the accompanying drawings.

[Semiconductor Test Apparatus]

Figure 1:
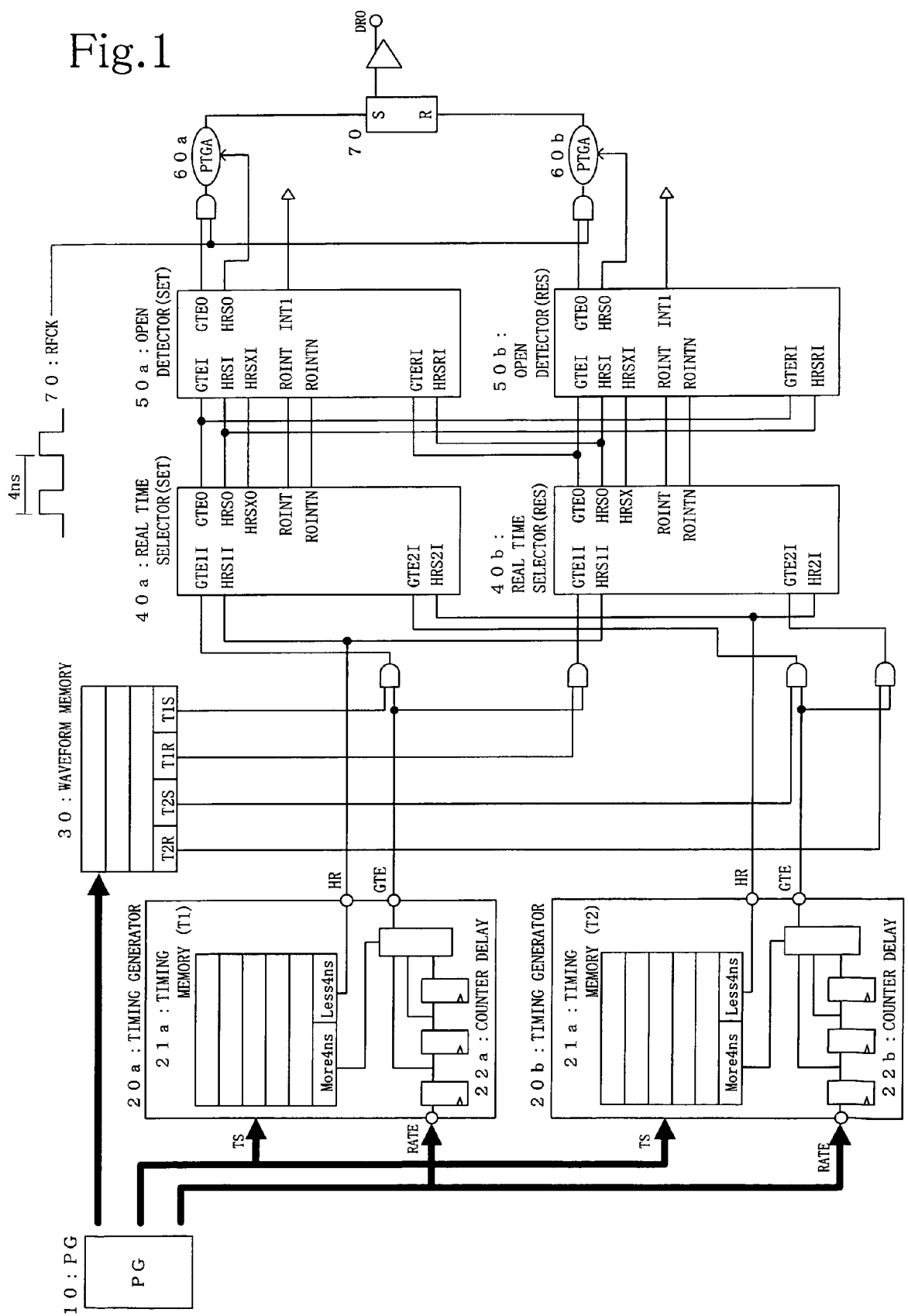
FIG. 1 is a block diagram showing a schematic structure of a semiconductor test apparatus comprising a waveform formatter circuit according to an embodiment of the present invention.

FIG. 1 is a block diagram showing a schematic structure of an embodiment of a semiconductor test apparatus comprising a waveform formatter circuit according to the present invention.

As shown in the drawing, the semiconductor test apparatus comprising the waveform formatter circuit according to this embodiment has substantially the same structure as that of the conventional semiconductor test apparatus shown in FIG. 6, and it comprises a pattern generator (PG) 10, a timing generator 20, a waveform memory 30, a real time selector 40, a timing circuit (PTGA) 60, a flip flop 70 and others as well as an open detector 50 which is provided on a later stage of the real time selector 40. Further, test pattern data transmitted through a timing circuit (PTGA) 60 and a flip flop 70 is applied to a non-illustrated DUT, thereby conducting a predetermined semiconductor test. It should be noted that within the context of the present invention, the term "open" is used for describing a situation where a signal or data is inhibited or suppressed to be transmitted to later stages of a waveform formatter circuit and a semiconductor test apparatus.

Of the respective constituent elements, the waveform memory 30 and the elements on the next stage constitute the waveform formatter circuit.

Here, the semiconductor test apparatus according to this embodiment constitutes a per-pin tester in which a plurality of timing generators or waveform formatter circuits are provided in accordance with per-pins of a DUT.

The per-pin tester is a semiconductor test apparatus having a function which can independently set a test signal applied to a DUT in accordance with each test pin. In the per-pin tester, a primary internal device resource of the testing apparatus is individually provided to each tester pin. On the contrary, a shared resource tester is a semiconductor test apparatus in which a plurality of resources such as timing generators or waveform formatter circuits are shared by all tester pins.

As shown in FIG. 1, the PG 10, the timing generator 20 and the waveform memory 30 according to this embodiment are the same as the PG 110, the timing generator 120 and the waveform memory 130 in the conventional semiconductor test apparatus described above with reference to FIG. 6, thereby avoiding repeated explanation.

Figure 6:
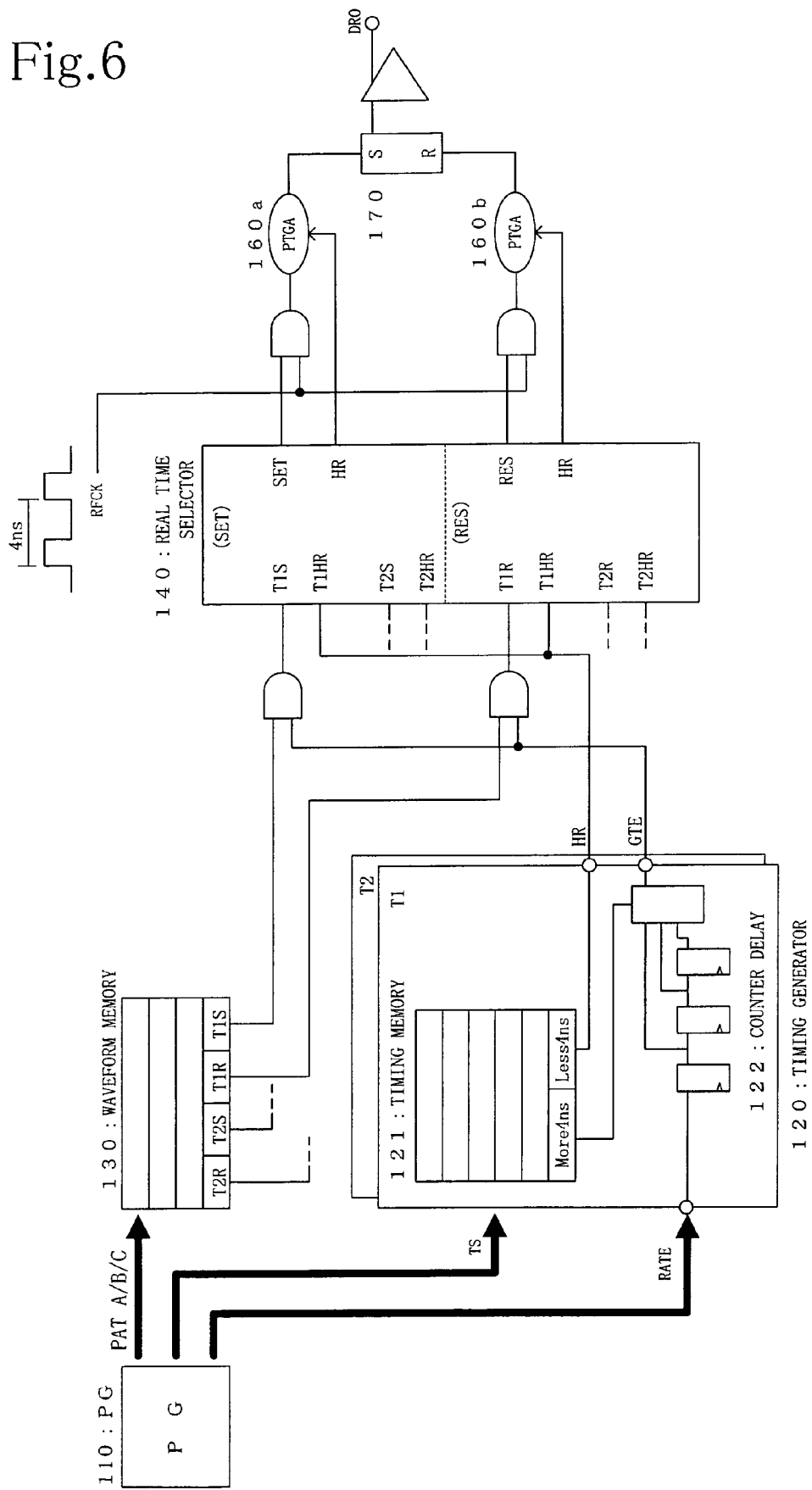
FIG. 6 is a block diagram showing a schematic structure of a conventional semiconductor test apparatus.

It is to be noted that, in this embodiment, a test of a pin multiplex mode using two sets of data in one test cycle is provided like the semiconductor test apparatus shown in FIG. 6, the waveform memory 30 outputs waveform data of groups T1 and T2, and two timing generators 20a (T1 side) and 20b (T2 side) of T1 and T2 are provided as the timing generator 20 in accordance with the groups of the waveform data output from the waveform memory 30 (see FIG. 1).

[Real Time Selector]

Figure 2:
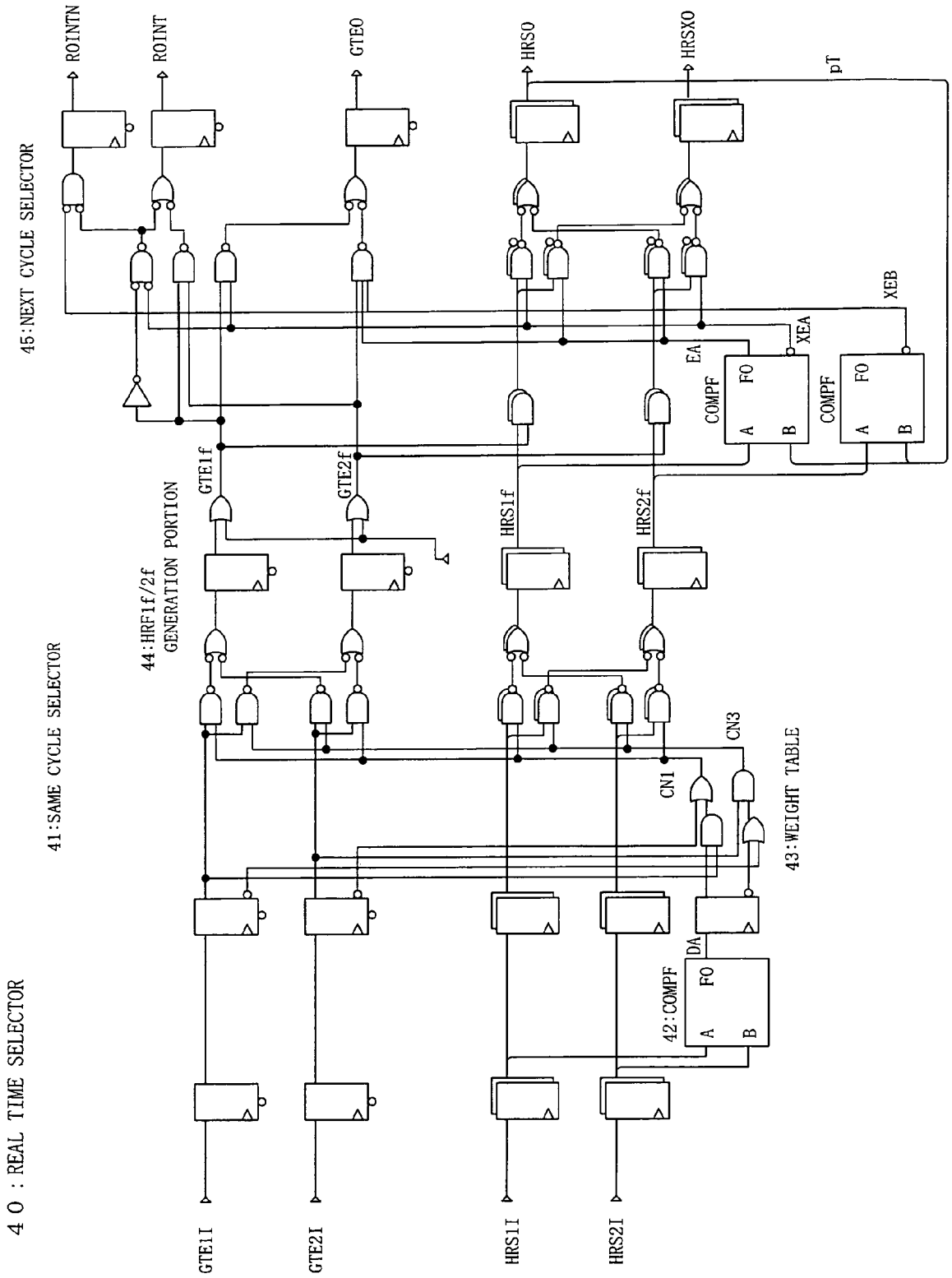
FIG. 2 is a block diagram showing a schematic structure of a real time selector included in the waveform formatter circuit according to the embodiment of the present invention.

FIG. 2 is a block diagram showing a schematic structure of a real time selector 40 included in the waveform formatter circuit according to this embodiment.

As shown in this drawing, the real time selector 40 receives two sets of waveform data output from the waveform memory 30, i.e., waveform data GTE1I and GTE2I of T1 and T2 on the SET side and two sets of timing data HRS1I and HRS2I output from the timing generator 21 as delay timing data of the waveform data, and selects and outputs predetermined waveform data and timing data (GTEO and HRSO, HRSXO).

Furthermore, if there are edges having the same polarity which are continuous in a period shorter than a predetermined proximity limit time (4 ns) exist in edge timings of the input waveform data GTE1I and GTE2I, continuous following edges are opened, and predetermined open signals (ROINT, ROINTN) are output. Here, in the present invention, an open signal may also be referred to as an inhibiting signal to indicate that a certain edge is opened (inhibited). Also, in the present invention, the predetermined proximity limit time is a time length equal to or substantially equal to one cycle of the reference clock.

It is to be noted that FIG. 2 show the real time selector 40a on the SET side only, but the real time selector 40b having the same structure is also provided on the RES side as shown in FIG. 1 and it operates like that of the SET side which will be described below.

Figure 7:
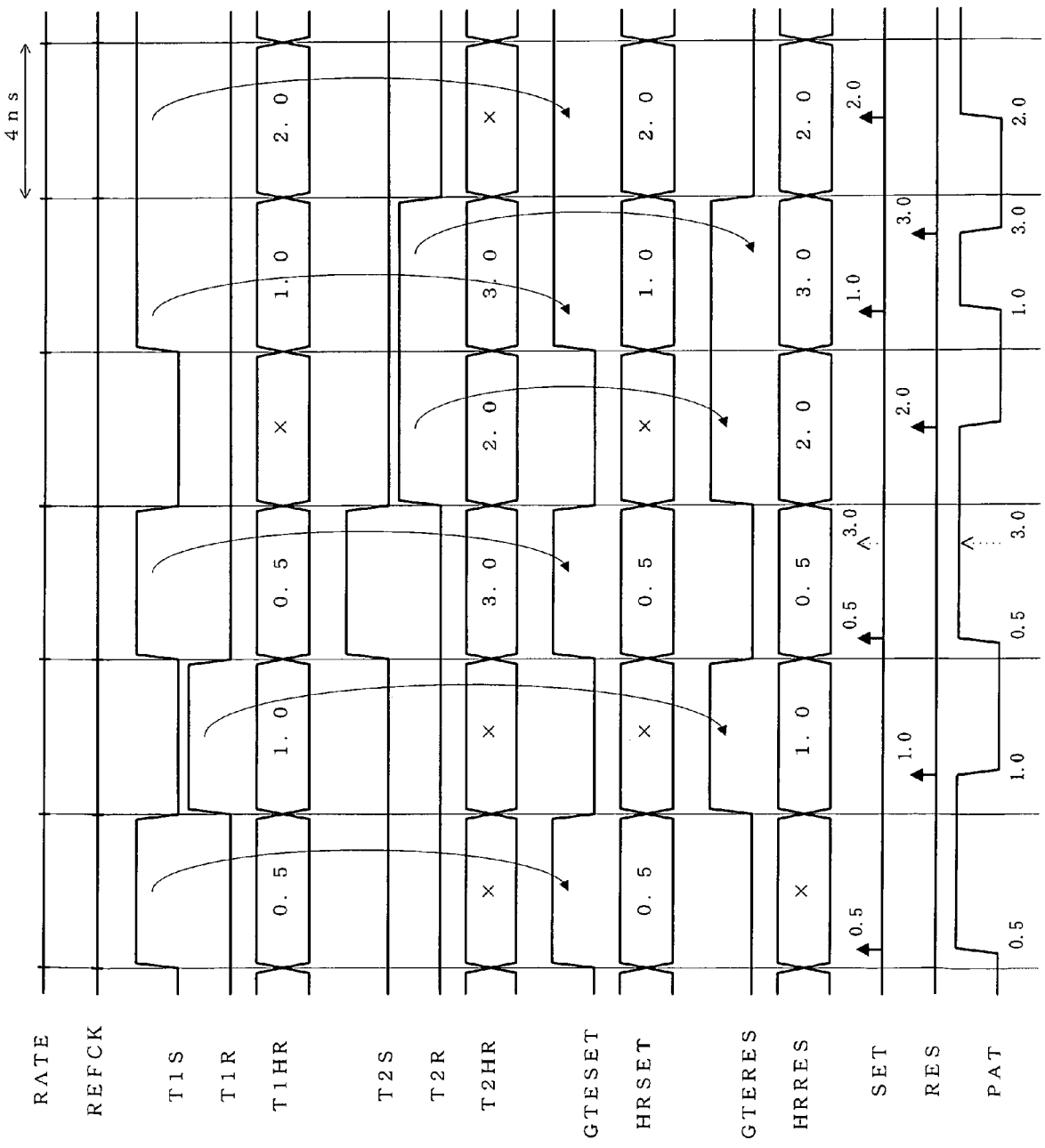
FIG. 7 shows a timing chart of a test pattern generated in the semiconductor test apparatus.
Figure 8:
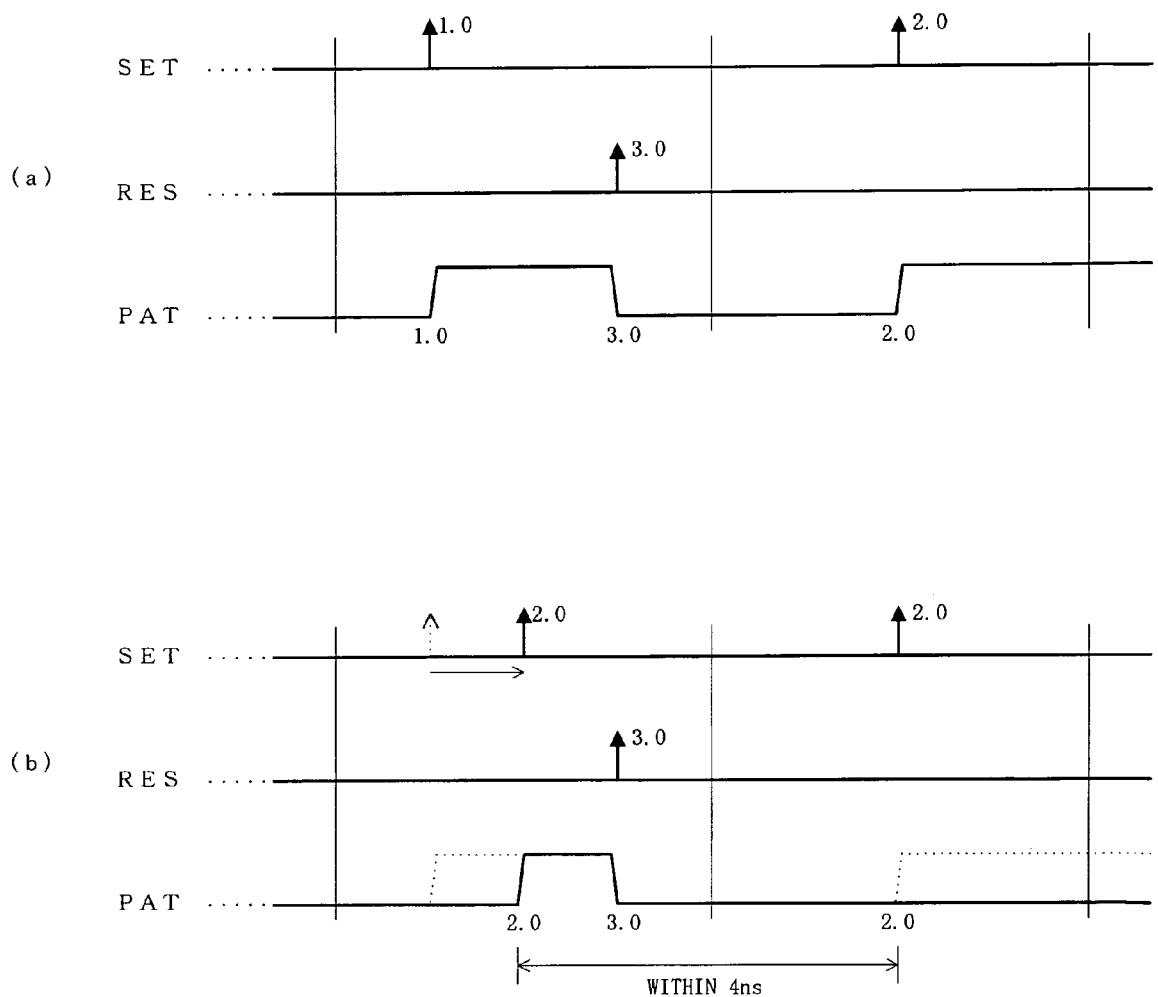

Specifically, if the same reference clock cycle has one edge of the waveform data (GTE1I or GET2I), the real time selector 40 selects and outputs this edge and corresponding timing data (see the first cycle in FIG. 7 described above).

On the other hand, if the same reference clock cycle has a plurality of edges of the waveform data (GTE1 and GTE2), the real time selector 40 compares respective sets of timing data (HRS1I and HRS2I) corresponding to the respective edges with each other, and selects and outputs an edge having small timing data and this timing data (GTEO and HRSO) (see the third cycle in FIG. 7).

Moreover, as to an edge having large timing data, this edge is opened and erased, an open signal (ROINT or ROINTN) is output, and timing data (HRSXO) corresponding to the opened edge is output.

Additionally, in case of opening edge/edges, the real time selector 40 outputs different open signals depending on situations, i.e., an open signal (ROINT) in a case where the number of the edge to be opened (inhibited) is one and open signals (ROINT and ROINTN) in a case where the plurality of edges are opened (inhibited). Here, in the present invention, an open signal (ROINT) may also be referred to as a first inhibiting signal and an open signal (ROINTN) may also be referred to as a second inhibiting signal.

A function and an operation of each element constituting the real time selector 40 will now be described hereinafter with reference to a truth table and logical expressions. It is to be noted that the following truth table and logical expressions are applied to the SET side, but they can be applied to the RES side.

First, the waveform data GTE1 and GTE2I and the timing data HRS1I and HRS2I input to the real time selector 40 are input to SAME CYCLE SELECTOR 41.

As shown in FIG. 2, the SAME CYCLE SELECTOR 41 comprises a plurality of flip flop circuits which output respective input data with predetermined timings, COMPF 42 which selects and outputs predetermined data from respective sets of data, WEIGHT TABLE 43 and a HRF1f/2f generation portion 44.

The COMPF 42 compares values of the two sets of timing data HRS1I and HRS2I with each other, and outputs a signal FO (DA) when a value of HRS2I on the T2 side is larger (has a larger delay quantity).

Outputs from the COMPF 42 can be represented in terms of truth values as shown in the following Table 1.

TABLE 1

| in | F0 |
|---|---|
| A < B | 1 |
| A > B | 0 |
| A = B | 0 |

The WEIGHT TABLE 43 comprises a plurality of AND gates and OR gates, receives an output signal DA from the COMPF 42, also receives the two sets of waveform data GTE1I and GTE2I, and outputs an output signal CN1 or CN3.

Outputs from the WEIGHT TABLE 43 can be represented in terms of truth values as shown in the following Table 2.

TABLE 2

| GTE2I | GET1I | DA | CN3 | CN1 |
|---|---|---|---|---|
| 0 | 0 | x | 0 | 1 |
| 0 | 1 | x | 0 | 1 |
| 1 | 0 | x | 1 | 0 |
| 1 | 1 | 0 | 1 | 0 |
| 1 | 1 | 1 | 0 | 1 |

The HRF1f/2f generation portion 44 comprises a plurality of AND gates and OR gates which are provided for the waveform data and the timing data.

The gate for the waveform data receives the two sets of waveform data GTE1I and GTE2I, also receives the output signals CN1 and CN3 from the WEIGHT TABLE 43, and outputs output signals GTE1f and GTE2f.

The gate for the timing data receives the two sets of timing data HRS1I and HRS2I, also receives the output signals CN1 and CN2 from the WEIGHT TABLE 43, and outputs output signals HRS1f and HRS2f.

The outputs GTE1f, GET2f, HRS1f and HRS2f from the HRF1f/2f generation portion 44 can be represented in logical expression as shown in the following Table 3.

TABLE 3

Outputs from HRF1f/2f generation portion

GTE1f = GTE1I * CN1 + GTE2I * CN3
GTE2f = GTE1I * CN3 + GTE2I * CN1
HRS1f = HRS1I * CN1 + HRS2I * CN3
HRS2f = HRS1I * CN3 + HRS2I * CN1

Selection and output of data by the above-described SAME CYCLE SELECTOR 41 can be represented in truth values as shown in the following Table 4.

TABLE 4

| GTE2I | GTE1I | HR1 | DA | CN3 | CN1 | HRS2f | HRS1f | GTE2f | GTE1f |
|---|---|---|---|---|---|---|---|---|---|
| 0 | 0 | | x | 0 | 1 | HRS2I | HRS1I | 0 | 0 |
| 0 | 1 | | x | 0 | 1 | HRS2I | HRS1I | 0 | 1 |
| 1 | 0 | | x | 1 | 0 | HRS1I | HRS2I | 0 | 1 |
| 1 | 1 | HRS2I <= HRS1I | 0 | 1 | 0 | HRS1I | HRS2I | 1 | 1 |
| 1 | 1 | HRS1I < HRS2I | 1 | 0 | 1 | HRS2I | HRS1I | 1 | 1 |

Furthermore, the output signals GTE1f, GTE2f, HRS1f and HRS2f from this SAME CYCLE SELECTOR 41 are input to NEXT CYCLE SELECTOR 45 on the next stage.

The NEXT CYCLE SELECTOR 45 comprises two comparison circuits (COMPF) for the two sets of timing data HRS1f and HRS2f, and a plurality of AND gates and OR gates which are provided for the waveform data and the timing data.

The two COMPFs compare a value of the timing data HRS1f or HRS2f with a value of HRSO(pT) as an output of final timing data, and outputs a signal FO (EA on the HRS1f side, EB on the HRS2f side) when the value of HRS1f or HRS2f is larger (has a larger delay quantity). Truth values of the outputs from the two COMPFs are the same as those in Table 1.

The waveform data gate of the NEXT CYCLE SELECTOR 45 receives the two sets of waveform data GTE1f and GTE2f, also receives output signals EA and XEA from the two COMPFs, outputs GTEO as an output of the final waveform data and also outputs ROINT and ROINTN as open signals (first and second inhibiting signals) which are used when GTEO is opened to be prevented from being output. Here, as to the open signals ROINT and ROINTN, when one edge alone of GTEO is opened in the same cycle, ROINT (first inhibiting signal) only is output, whilst ROINTN (second inhibiting signal) is not output. On the contrary, when two edges of GTEO are opened in the same cycle, both ROINT and ROINTN (first and second inhibiting signals) are output.

The waveform data gate of the NEXT CYCLE SELECTOR 45 receives the two sets of timing data HRS1f and HRS2f, also receives EA and XEA output from the two COMPF, and outputs HRSO which is an output of final timing data and HRSXO which is timing data of an opened edge when GTEO is opened.

Selection and output of data by the NEXT CYCLE SELECTOR 45 mentioned above can be represented in truth values as shown in the following Table 5.

TABLE 5

|  | EB | EA | GTEO | HRSO | HRSXO | ROINT |
|---|---|---|---|---|---|---|
| pT < HRS1f < HRS2f | 0 | 0 | GTE1f | HRS1f | HRS2f | 0 |
| HRS1f = pT < HRS2f | 0 | 0 | GTE1f | HRS1f | HRS2f | 0 |
| HRS1f < pT < HRS2f | 0 | 1 | GTE2f | HRS1f | HRS1f | 1 |
| HRS1f < pT = HRS2f | 0 | 1 | GTE2f | HRS2f | HRS1f | 1 |
| HRS1f < HRS2f = Pt | 1 | 1 | 0 | HRS1f | HRS1f | 1 |

The output from this NEXT CYCLE SELECTOR 45 is a final output from the real time selector 40.

As a result, the outputs from the real time selector 40 can be represented in logical expressions as shown in the following Table 6, and the respective outputs GTEO, HRSO, HRSXO, ROINT, ROINTN are input to the open detector 50 on the next stage.

TABLE 6

Outputs from the real time selector

GTEO = GTE1f * XEA + GTE2I * EA * XEB
HRSO = HRS1f * GTE1f * XEA + HRS2f * GTE2f * EA
HRSXO = HRS1f * GTE1f * EA + HRS2f * GTE2f * XEA
ROINT = GTE1f * EA + GTE1f * GTE2f
   (NEXT CYCLE) (SAME CYCLE)
ROINT = GTE1f * EB * EA
   (NEXT both edge open)

[Open Detector]

Figure 3:
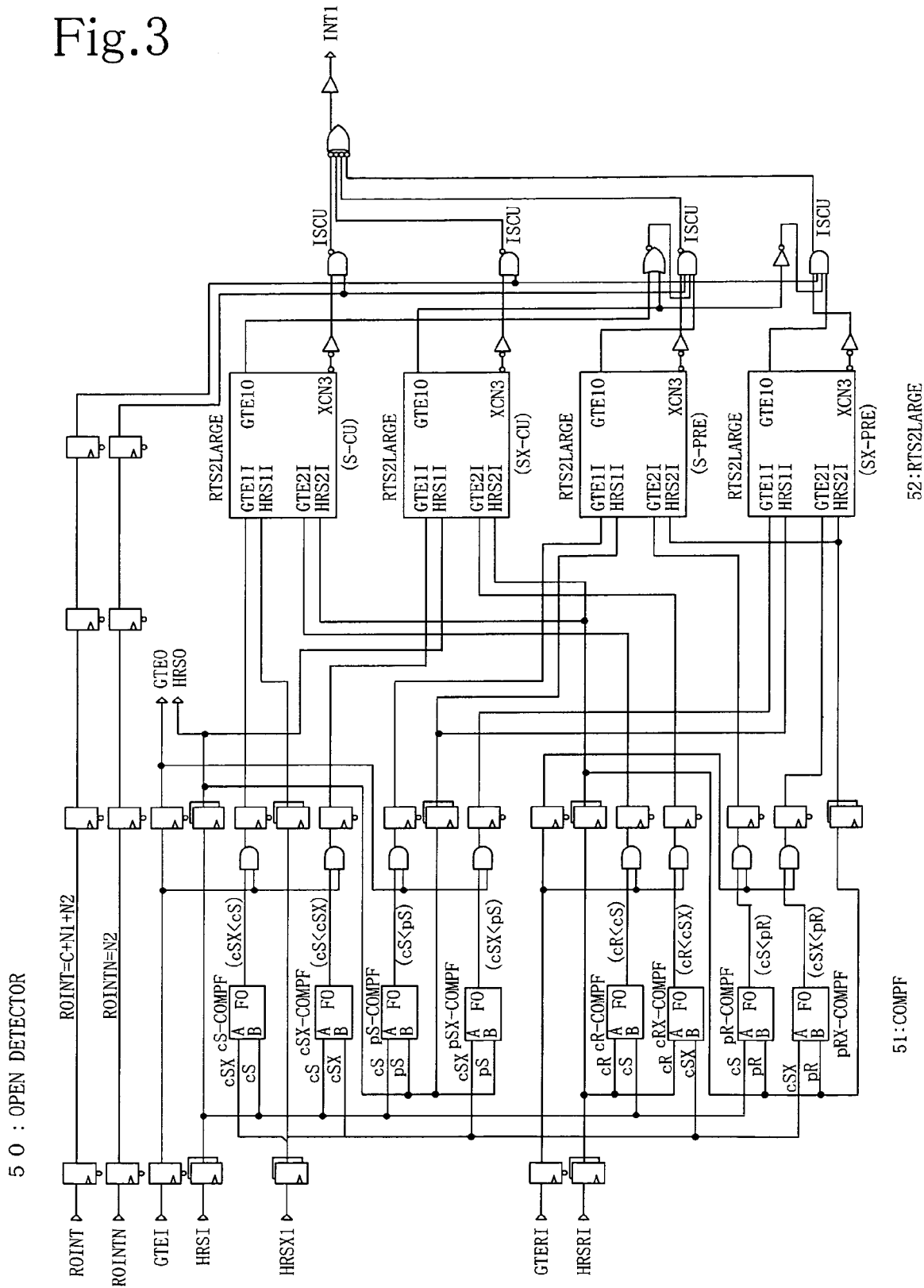
FIG. 3 is a block diagram showing a schematic structure of an open detector included in the waveform formatter circuit according to the embodiment of the present invention.

FIG. 3 is a block diagram showing a schematic structure of the open detector 50 included in the waveform formatter circuit according to this embodiment. Here, the open detector 50 may also be referred to simply as a detector 50 which receives various data and detects conditions of various data received and generates a fail signal when a predetermined condition is met.

As shown in FIG. 3, the open detector 50 receives the waveform data GTEI and GTERI, the timing data HRSI and HRSIX and the open signals (first and second inhibiting signals) ROINT and ROINTN output from the real time selector 40 (the real time selector 40a on the SET side), and also receives the waveform data GTERI and its timing data HRSRI output from the real time selector 40b on the RES side (see FIG. 1)

Further, if an edge having a polarity (RES with respect to SET) which is reverse to that of an opened edge exists in a predetermined proximity limit time (which is a time length of one cycle of the reference clock REFCK, i.e., 4 ns) before the edge opened by the real time selector 50, a predetermined fail signal (INT1) is output.

It is to be noted that FIG. 3 shows the open detector 50a only, an open detector 50b having the same structure is also provided on the RES side as shown in FIG. 1 and operates in the same manner as that on the SET side which is described below.

Specifically, if a maximum edge having corresponding timing data (HRSI or HRSRI) smaller than timing data (HRSXI) of an edge opened by the real time selector 40 exists in a reference clock cycle to which the opened edge belongs, the fail signal is output (INT1) when a polarity of this edge is reverse to that of the opened edge.

Furthermore, if a maximum edge having timing data (HRSI or HRSRI) larger than timing data (HRSXI) of an opened edge exists in a reference clock cycle before a reference clock cycle to which the opened edge belongs, the fail signal is output (INT1) when a polarity of this edge is reverse to that of the opened edge.

FIG. 4 is a table showing an operation principle of the open detector 50 according to this embodiment.

As indicated by I in this drawing, first, when the open signal (ROINT or ROINTN) is not input from the real time selector 40, a result of OPEN detection becomes PASS, and the open detector 50 does not output the FAIL signal since an edge (opened edge) which conflicts with the proximity limit does not exist as seen from a reference edge (Current Cycle S).

On the other hand, when the open signal is input from the real time selector 40, OPEN detection is carried out in the open detector 50 as follows.

First, when ROINT only is input as the open signal, as indicated by II in FIG. 4, whether an edge smaller than a reference edge (Current Cycle S or SX) exists in the same cycle (Current Cycle) as the reference edge is detected.

If such an edge exists in the same cycle, this corresponds to the current open indicated by II(1) in FIG. 4, and presence/absence of a maximum edge smaller than the opened edge (Current Cycle SX) is judged. Moreover, if the target edge exists, a detection result is PASS and the FAIL signal is not output when the polarity of this target edge is the same as that of the opened edge (SET with respect to SET, RES with respect to RES), whereas the FAIL signal is output in case of the reverse polarity (RES with respect to SET, SET with respect to RES).

On the contrary, if an edge smaller than the reference edge does not exist in the same cycle, this corresponds to the previous open indicated by II(1) in FIG. 4, and whether a maximum edge in the previous cycle (Previous Cycle) which is smaller than an opened edge (Current Cycle SX) exists in the previous cycle of the opened edge is judged. Additionally, if the target edge exists, a detection result becomes PASS and the FAIL signal is not output when the polarity of this target edge is the same as that of the opened edge, whereas the FAIL signal is output in case of the reverse polarity.

Further, as indicated by III in FIG. 4, when the both open signals ROINT and ROINTN are input to the open detector 50 from the real time selector 40, two edges are opened in the same cycle, and the current open and the previous open indicated by II in FIG. 4 are judged with respect to each opened edge (Current Cycle S or SX).

Furthermore, if the target edge whose polarity is reverse to that of the opened edge exists, the FAIL signal is output.

Functions and operations of each element constituting the open detector 50 will now be described hereinafter with reference to a truth table and logical expressions. Although the following truth table and the logical expressions are provided on the SET side, they can be applied to the RES side.

First, as shown in FIG. 3, of the data input to the open detector 50, the timing data HRS1I, the timing data HRSXI of the opened edge and the timing data HRSRI on the RES side are input to a COMPF 51.

The COMPF 51 comprises COMPFs on eight stages, SET side COMPFs are provided on the upper four stages, RES side COMPFs are provided on the lower four stages, and cS-COMPF, cSX-COMPF, pS-COMPF, pSX-COMPF, cR-COMPF, cRX-COMPF, pR-COMPF and pRX-COMPF are provided from above.

In the SET side COMPFs on the upper four stages, a value of the timing data HRSI (cS or pS) is compared with a value of the timing data HRSXI (cSX) of the opened edge. In the RES side COMPFs on the lower four stages, a value of the timing data HRSI (cS), a value of the timing data HRSRI (cR or pR) on the RES side and a value of the timing data HRSXI (cSX) of the opened edge are compared with each other.

It is to be noted that cS denotes HRS1I of the current cycle; pS, HRS1I of the previous cycle; and cSX, HRSXI of the current cycle. Moreover, cR designates HRSRI of the current cycle; and pR, HRSRI of the previous cycle.

Outputs from each COMPF of the COMPF 51 are represented in truth values as shown in the following Table 7.

TABLE 7

| in | F0 |
|---|---|
| A < B | 1 |
| A > B | 0 |
| A = B | 0 |

Additionally, each COMPF outputs output signals cS, cSX, pS and pS in case of cS-COMPF=cSX<cS, cSX-COMPF=cS<cSX, pS-COMPF=cS<pS, and pSX-COMPF=cSX<pX from above.

Further, the RES side outputs output signals cS, cSX, pS, pR and pR in case of cR-COMPF=cR<cS, cRX-COMPF=cR<cSX, pR-COMPF=cS<pR, and pRX-COMPF=cSX<pR.

As to each output of the COMPF 51, the four stages on the SET side take AND with the SET side waveform data GTE1, and the four stages on the RES side take AND with the RES side waveform data GTE1. These outputs are input to the flip flop on the next stage, and further input to RTS2LARGE 52 on the rear stage.

As shown in FIG. 3, the RTS2LARGE 52 comprises RTS2LARGE on four stages, i.e., S-Current, SX-Current, S-Previous and SX-Previous from above.

To the RTS2LARGE of S-current receives the output cS of the cS-COMPF and the timing data HRSXI of the opened edge, and also receives the output cS of the cR-COMPF and the timing data HRSRI of the RES side current cycle.

The RTS2LARGE of SX-Current receives the output cSX of the cSX-COMPF and the timing data HRSI of the current cycle, and also receives the output cSX of the cRX-COMPF and the timing data HRSRI of the RES side current cycle.

The RTS2LARGE of S-Previous receives the output pS of the pS-COMPF and the timing data HRSI of the previous cycle, and also receives the output pR of the pR-COMPF and the timing data HRSRI of the RES side previous cycle.

The RTS2LARGE of SX-Previous receives the output pS of the pSX-COMPF and the timing data HRSI of the previous cycle, and also receives the output pR of the pRX-COMPF and the timing data HRSRI of the RES side previous cycle.

In the above-described RTS2LARGE 52, predetermined output signals GTE1O and CN3 are output in accordance with the input data.

The outputs from this RTS2LARGE 52 can be represented in truth values as shown in the following Table 8

TABLE 8

| GTE2I | GTE1I | HRSI | HRS2 | CN3 | GTE1O |
|---|---|---|---|---|---|
| 0 | 0 | | | 0 | 0 |
| 0 | 1 | | | 0 | 1 |
| 1 | 0 | | | 1 | 1 |
| 1 | 1 | HRS2I <= HRS1I | | 0 | 1 |
| 1 | 1 | HRS1I < HRS2I | | 1 | 1 |

Furthermore, the respective outputs GTE1O and CN3 from the RTS2LARGE on the four stages of this RTSLARGE 52 are subjected to AND processing with the open signal ROINT or ROINTN. When any AND can be taken, INT1 is output as the above-described FAIL signal (see FIG. 4).

Incidentally, although not shown in FIG. 3, test patterns on the set side (SET) and the reset side (RES) selected and output by the real time selector 40 are output from the open detector 50 as they are, and applied to the DUT. As described above, in this embodiment, although a test pattern selected by the real time selector 40 is output through the open detector 50, but the test pattern itself can be directly applied to the DUT from the real time selector 40 without using the open detector 50. In such a case, the open detector 50 functions as a circuit dedicated for detection of an opened edge.

[Open Detection Operation]

A concrete example of the operation of the open detector 50 in the semiconductor test apparatus according to this embodiment having the above structure will now be described with reference to FIG. 5.

Figure 5:
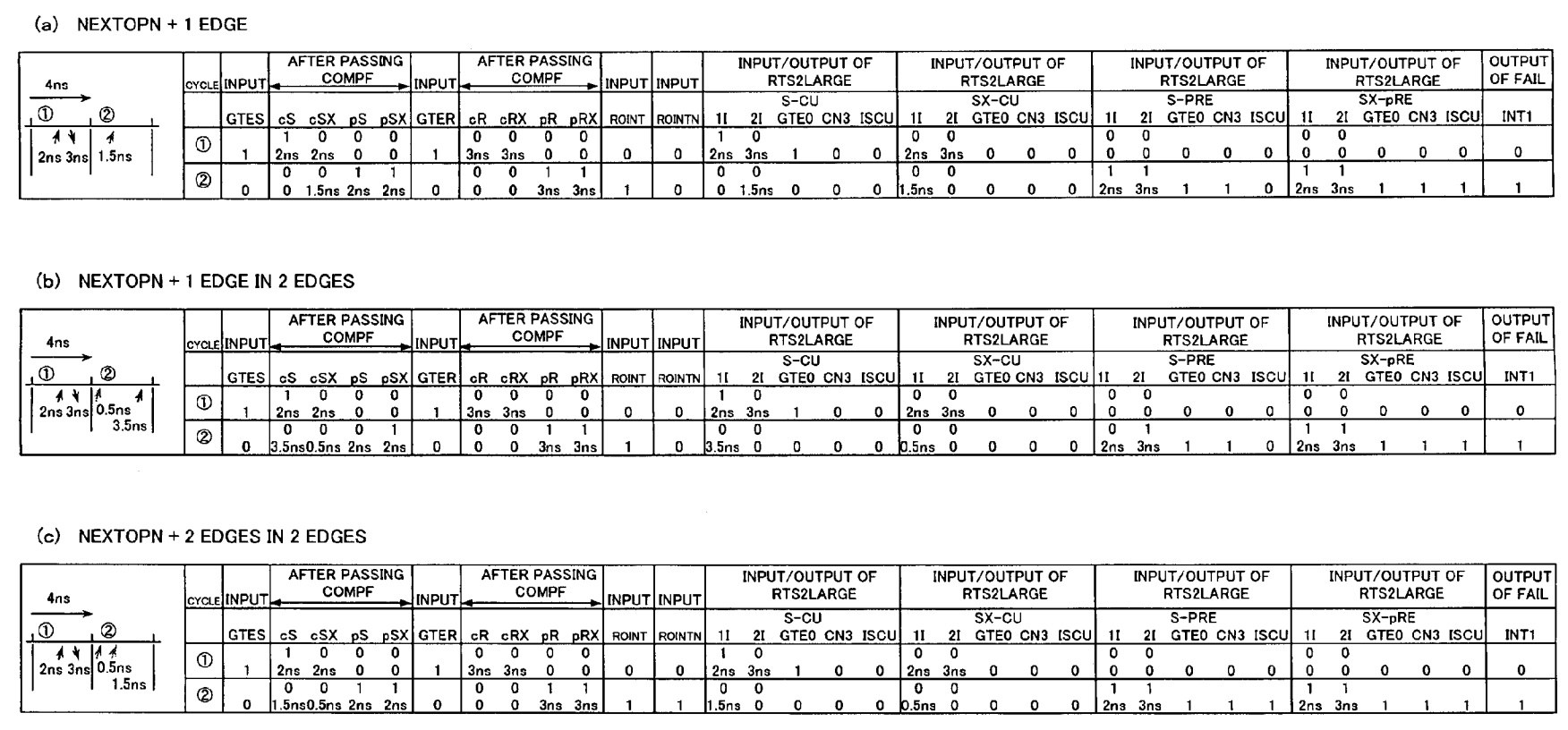

FIG. 5 is tables showing concrete examples of signals input to/output from an open detector real 50 included in the waveform formatter circuit according to this embodiment.

First, in an example shown in FIG. 5(a), one edge is opened in the second cycle. Specifically, SET is generated in 2 ns of the first cycle, RES is generated in 3 ns of the same, and SET is generated in 1.5 ns of the next cycle. In this case, since SET is generated in 2 ns in the first cycle, SET in 1.5 ns is opened in the second cycle.

In this case, each signal shown in the column ①  is input to the open detector 50 in the first cycle. For example, since cS=2 ns, cSX=0 ns, cR=3 ns and cRX=0 ns are achieved in this first cycle, cS=cSC<cS=1, cSX=cS<cSX=0, cR=cR<cS=0, cRX=cRX<cSX=0 and others are obtained.

Outputs from each corresponding COMPF are input to each RTS2LARGE on the fours stages.

In this first cycle, the both open signals ROINT and ROINTN have a value of "0", INT1 of the FAIL signal is not output.

In the second cycle, as shown in the column ② , the input GTES on the SET side is opened to become "0", and the timing data (1.5 ns) of the opened edge appears at cSX-COMPF. Each COMPF outputs the current data of the first cycle as previous data of the second cycle. Moreover, in this case, since one edge is opened, "1" is set in the open signal ROINT.

Additionally, "1" is set in the output CN3 of the RTS2LARGE of SX-Previous (see Table 8), ISCU takes "1" due to AND processing with ROINT, and INT1 of the FAIL signal is output.

In an example shown in FIG. 5(*b*), one of two edges is opened in the second cycle.

Specifically, SET is generated in 2 ns of the first cycle, RES is generated in 3 ns of the same, and SET is generated in 0.5 ns and 3.5 ns of the next cycle. Since SET is generated in 2 ns of the first cycle, SET in 0.5 ns of the second cycle is opened, and SET in 3.5 ns appears.

In this case, the first cycle is the same as (a) mentioned above.

In the second cycle, as shown in the column ② , the input GTES on the SET side is opened to become "0", and the timing data (0.5 ns) of the opened edge appears at cSX-COMPF. Further, since one edge is opened, "1" is set in ROINT as an open signal.

Furthermore, in this case, "1" is set in the output CN3 of RTS2LARGE of SX-Previous (see Table 8), ISCU takes "1" due to AND processing with ROINT, and INT1 of the FAIL signal is thereby output.

It is to be noted that "1" is also set in the output CN3 of the RTS2LARGE of S-Previous (see Table 8), but CN3 takes AND with ROINT in the RTS2LARGE of S-Previous (see FIG. 3), and hence ISCU becomes "0".

Moreover, FIG. 5(*c*) shows an example in which two of two edges are opened in the second cycle.

Specifically, SET is generated in 2 ns of the first cycle, RES is generated in 3 ns of the same, and SET is generated in 0.5 ns and 1.5 ns of the next cycle. As a result, SET is generated in 2 ns of the first cycle, and hence both SET in 0.5 ns and SET in 1.5 ns of the second cycle are opened.

In this case, the first cycle is likewise the same as (a) and (b) mentioned above.

In the second cycle, as shown in the column ② , the input GTES on the SET side is opened to become "0", and the timing data (0.5 ns) of the opened edge appears at the cSX-COMPF. Additionally, since the two edges are opened, "1" is set in both ROINT and ROINTN as open signals.

Further, in this case, "1" is set in each output CN3 of the RTS2LARGE of S-Previous and the RTS2LARGE of SX-Previous (see Table 8), "1" is set in ISCU of CN3 from the RTS2LARGE of S-Previous due to AND processing with ROINTN and of CN3 of the RTS2LARGE of SX-Previous due to AND processing with ROINT, and INT1 of the FAIL signal is output.

As described above, according to the semiconductor test apparatus comprising the waveform formatter circuit of this embodiment, when an edge of a test pattern conflicts with a proximity limit of a reference clock, a proximate following edge is automatically opened by the real time selector 40, and the opened edge is detected by the open detector 50.

Furthermore, the open detector 50 outputs a fail signal only when an edge whose polarity is reverse to that of the opened edge exists in a proximity limit time before the opened edge, but does not output the fail signal in any other case even if the opened edge exists.

That is, the open detector 50 according to this embodiment can assuredly detect an opened edge only which affects the test pattern and truly requires an error warning or the like.

As a result, an accurate error warning or the like can be performed in real time based on the fail signal output from the open detector 50, and the accurate semiconductor test can be assuredly conducted based on the reference clock.

Although the above has described the waveform formatter circuit and the semiconductor test apparatus according to the present invention with reference to the preferred embodiment, the waveform formatter circuit and the semiconductor test apparatus according to the present invention are not restricted to the foregoing embodiment, and it is needless to say that various modifications can be carried out within the scope of the present invention.

For example, although the description has been given as to the example of the pin multiplex mode using two sets of data in one test cycle in the foregoing embodiment, the number of data sets to be used is not restricted to two, and three or more data sets can be used.

Further, although the above has described that it is preferable to use the present invention in the per-pin tester in the foregoing embodiment, but a target of the present invention is not restricted to the per-pin tester only, and the present invention can be of course applied to a conventional shared tester.

As described above, the present invention can be preferably used as a semiconductor test apparatus which tests a semiconductor component such as an IC or an LSI.

The invention claimed is:

1. A waveform formatter circuit which generates a test pattern which is input to a DUT (device under test), comprising:
    a real time selector which receives a plurality of sets of waveform data output from a waveform memory, receives a plurality of sets of timing data output from a timing generator, selects and outputs predetermined waveform data and timing data, and inhibits an edge that comes immediately after a current edge and outputs a predetermined inhibiting signal when two edges with the same polarity which are continuous exist in an interval shorter than a predetermined proximity limit time in the waveform data; and
    a detector which receives the waveform data, the timing data and the inhibiting signal output from the real time selector, and outputs a predetermined fail signal when an edge with a polarity reverse to that of an edge inhibited by the real time selector exists in the predetermined proximity limit time before the inhibited edge.

2. The waveform formatter circuit according to claim 1, wherein,
    when one waveform data edge exists in the same reference clock cycle, the real time selector selects and outputs this edge and corresponding timing data; and when a plurality of waveform data edges exist in the same reference clock cycle, the real time selector compares delay timings indicated by the timing data corresponding to respective edges with each other, selects and outputs an edge having the timing data indicating a delay time smaller than that of another edge as well as the timing data itself, inhibits the another edge indicating a larger delay timing by the timing data and outputs an inhibiting signal, and outputs timing data corresponding to the inhibited edge.

3. The waveform formatter circuit according to claim 2, wherein, when inhibiting an edge which comes immediately after a current edge within the predetermined proximity limit time, the real time selector outputs either one or both of first and second inhibiting signals depending on when one edge is inhibited or where a plurality of edges are inhibited.

4. The waveform formatter circuit according to claim 3, wherein, when a maximum edge whose corresponding delay timing indicated by the timing data is smaller than that indicated by the timing data of an inhibited edge inhibited in the real time selector exists in a reference clock cycle to which the inhibited edge belongs, the detector outputs a fail signal when a polarity of the edge is reverse to that of the inhibited edge; and when a maximum edge whose corresponding delay timing indicated by the timing data is larger than that indicated by the timing data of the inhibited edge exists in a reference clock cycle before the reference clock cycle to which the inhibited edge belongs, the detector outputs the fail signal when a polarity of the edge is reverse to that of the inhibited edge.

5. A semiconductor test apparatus which inputs a predetermined test pattern to a DUT (device under test), and compares a response output signal output from the DUT with a predetermined expected data signal, thereby judging the quality of the DUT, comprising:

a waveform formatter circuit which generates a test pattern which is input to the DUT, wherein the waveform formatter circuit comprises the waveform formatter circuit defined in claim 1.

6. The semiconductor test apparatus according to claim 5, wherein the plurality of waveform formatter circuits are provided in accordance with per-pins in the DUT.

* * * * *